United States Patent
Tang et al.

(10) Patent No.: US 6,400,036 B1
(45) Date of Patent: Jun. 4, 2002

(54) FLIP-CHIP PACKAGE STRUCTURE AND METHOD OF FABRICATING THE SAME

(75) Inventors: Wei-Sen Tang, Chang Hwa Hsien; Han-Ping Pu, Taipei Hsien, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/920,069

(22) Filed: Aug. 1, 2001

Related U.S. Application Data

(62) Division of application No. 09/629,072, filed on Jul. 29, 2000.

(30) Foreign Application Priority Data

Jun. 3, 2000 (TW) .......................................... 89110849

(51) Int. Cl.[7] ................................................ H01L 21/44
(52) U.S. Cl. .................... 257/780; 257/738; 438/108
(58) Field of Search .................................. 257/780, 738

(56) References Cited

U.S. PATENT DOCUMENTS 6,228,681 B1 * 5/2001 Gilleo ........................ 438/108
6,245,595 B1 * 6/2001 Nguyen et al. ............. 438/108
6,265,776 B1 * 7/2001 Gilleo ........................ 257/738

* cited by examiner

*Primary Examiner*—David Nelms
*Assistant Examiner*—Theo P Le
(74) *Attorney, Agent, or Firm*—Peter F. Corless; Steven M. Jensen; Edwards & Angell, LLP

(57) ABSTRACT

A flip-chip package technology is proposed for use to fabricate a dual-chip integrated circuit package that includes two semiconductor chips in a single package unit, which is characterized in the forming of a flash-barrier structure that can help prevent the underfill material used in flip-chip underfill process from flashing to other unintended areas. The flash-barrier structure can be either a protruded dam structure over the underlying semiconductor chip, or a groove in a coating layer formed over the underlying semiconductor chip. During flip-chip underfill process, the flash-barrier structure can confine the underfill material within the intended area and prevent the underfill material from flowing to other unintended areas such as nearby bonding pads, so that the finished package product can be assured in quality and reliability.

5 Claims, 2 Drawing Sheets

FLIP-CHIP PACKAGE STRUCTURE AND METHOD OF FABRICATING THE SAME

This application is a divisional of U.S. application Ser. No. 09/629,072 filed Jul. 29, 2000.

BACKGROUND OF THE INVENTION

1. Field of the Invention

This invention relates to integrated circuit packaging technology, and more particularly, to a flip-chip packaging technology for use to fabricate a dual-chip integrated circuit package that includes two semiconductor chips in a single package unit.

2. Description of Related Art

The flip-chip packaging technology is an advanced integrated circuit packaging technology that allows the overall package size to be made very compact. The flip-chip package configuration differs from conventional art particularly in that it includes at least one semiconductor chip mounted in an upside-down manner over substrate or another semiconductor chip and electrically coupled to the same by means of solder bumps which are reflowed to solder pads on the flip-chip mounting surface. After the flip chip is readily bonded in position, however, a gap would be undesirably left between the chip and its underlying surface, which, if not underfilled, would easily cause the flip chip to suffer from fatigue cracking and electrical failure due to thermal stress when the entire package structure is being subjected to high-temperature conditions. As a solution to this problem, it is an essential step in flip-chip package fabrication to fill an underfill material, such as epoxy resin, into such a gap. The underfilled resin, when hardened, can serve as a mechanical reinforcement for the flip chip to cope against thermal stress. The involved fabrication process is customarily referred to as flip-chip underfill. By conventional flip-chip underfill technology, however, the underfill material would easily flow to other areas, causing undesired flash that would adversely affect subsequent wire-bonding process or passive-component mounting.

One solution to the foregoing problem is disclosed in the U.S. Pat. No. 5,218,234, which teaches the forming of a recessed portion in substrate to help prevent resin flash. In addition, the U.S. Pat. No. 5,120,678 teaches the forming of a dam structure on substrate to confine the underfill material within predefined area. These two patented technologies, however, are unsuitable for use on a dual-chip package structure wherein one chip is mounted in flip-chip manner over another one. This is because that it is required to form bonding pads on the active surface of the underlying chip (i.e., the carrier chip) for solder bonding to the overlying chip (i.e., the flip chip), and these bonding pads are located very near to the edge of the flip chip. In this case, the use of the patented technology of U.S. Pat. No. 5,120,678 would nevertheless cause resin flash on the bonding pads. As to the U.S. Pat. No. 5,218,234, since the underlying chip is provided without solder mask and with a plurality of exposed bonding pads, it is also unsuitable for use on a dual-chip package structure to solve the flash problem.

SUMMARY OF THE INVENTION

It is therefore an objective of this invention to provide a new flip-chip packaging technology that can help prevent the underfill material used in the flip-chip underfill process from flashing to other unintended areas and causing contamination to solder pads.

In accordance with the foregoing and other objectives, the invention proposes a new flip-chip packaging technology.

The flip-chip packaging technology comprises the following procedural steps: preparing a first semiconductor chip having an active surface and an inactive surface, with the active surface being formed with a chip-bonding area; wherein a plurality of inner bonding pads are formed in the chip-bonding area, while a plurality of outer bonding pads are formed beyond the chip-bonding area on the active surface; forming a coating layer over the active surface of the first semiconductor chip; etching away selected portions of the coating layer to expose the inner bonding pads and the outer bonding pads and meanwhile forming a flash-barrier structure around the chip-bonding area to separate the chip-bonding area from the outer bonding pads; electrically coupling a second semiconductor chip by means of solder bumps to the chip-bonding area on the first semiconductor chip, with a gap existing between the first semiconductor chip and the second semiconductor chip; and forming an underfill layer in the gap between the first semiconductor chip and the second semiconductor chip.

The flash-barrier structure can be either a protruded dam structure over the first semiconductor chip, or a groove in the coating layer, which can help prevent the underfill material from flowing to the areas therebeyond.

In terms of structure, the flip-chip packaging technology of the invention comprises: a first semiconductor chip having an active surface and an inactive surface, with the active surface being formed with a chip-bonding area; wherein a plurality of inner bonding pads are formed in the chip-bonding area, while a plurality of outer bonding pads are formed beyond the chip-bonding area on the active surface; a flash-barrier structure formed around the chip-bonding area of the first semiconductor chip to separate the chip-bonding area from the outer bonding pads; a second semiconductor chip electrically coupled to the first semiconductor chip by means of solder bumps to the chip-bonding area on the first semiconductor chip, with a gap existing between the first semiconductor chip and the second semiconductor chip; and an underfill layer formed in the gap between the first semiconductor chip and the second semiconductor chip.

The coating layer can be formed from, for example, polyimide or epoxy resin, and most preferably from polyimide.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

FIGS. 1A–1E are schematic sectional diagrams used to depict the procedural steps involved in the first preferred embodiment of the flip-chip packaging technology of the invention for fabricating a flip-chip package.

Figure 1A:
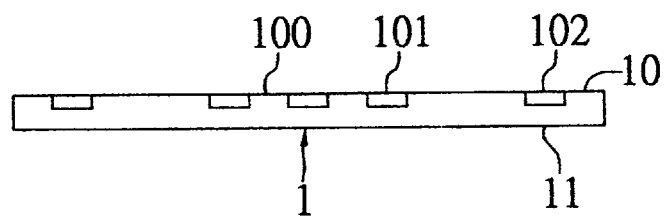
FIGS. 1A–1E are schematic sectional diagrams used to depict the procedural steps involved in a first preferred embodiment of the flip-chip packaging technology of the invention.

Referring to FIG. 1A, the first step is to prepare a first semiconductor chip 1 having an active surface 10, where integrated circuit components are formed, and an inactive surface 11, where no integrated circuit components are formed. The active surface 10 is formed with at least one chipbonding area 100. Further, a plurality of inner bonding pads 101 are formed in the chip-bonding area 100, while a plurality of outer bonding pads 102 are formed beyond the chip-bonding area 100 on the active surface 10. These bonding pads 101, 102 are fabricated through conventional technology, so description thereof will not be further detailed.

Figure 1B:
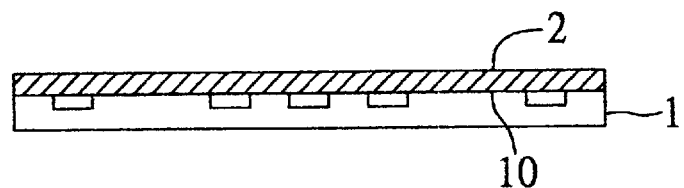

Referring further to FIG. 1B, in the next step, a polyimide coating 2 is formed over the active surface 10 of the first semiconductor chip 1. It is required that the thickness of the polyimide coating 2 be smaller than the height of the solder bumps used for flip-chip application so as to facilitate the subsequent reflow of the solder bumps.

Figure 1C:
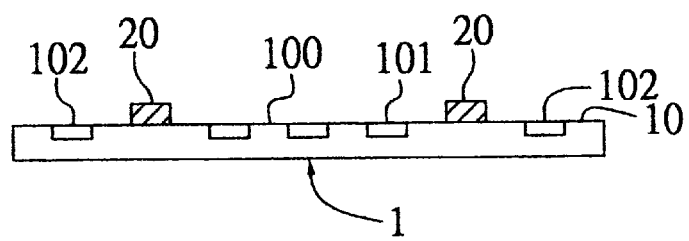

Referring further to FIG. 1C, in the next step, a dam structure 20 is formed beyond the chip-bonding area 100 of the active surface 10 and between the chip-bonding area 100 and the outer bonding pads 102 by etching away selected portions of the polyimide coating 2 through, for example, a dry-etching process, or a wet-etching process, or a plasma-etching process. The darn structure 20 encloses the chip-bonding area 100 and the inner bonding pads 101.

Figure 1D:
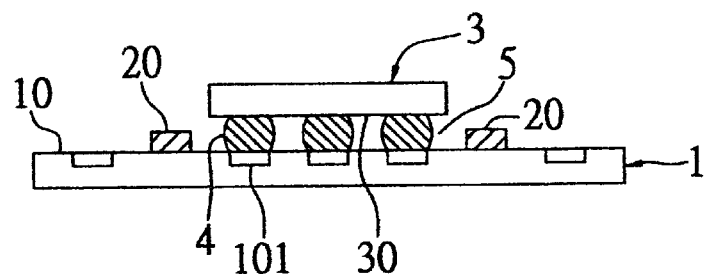

Referring further to FIG. 1D, in the next step, an UBM (Under Bump Metallization) process is performed on the inner bonding pads 101 on the active surface 10 of the first semiconductor chip 1, so as to form an electrically-conductive barrier layer (not shown) to help increase the bonding strength of the inner bonding pads 101 to solder bumps. The UBM process is conventional technology so description thereof will not be further detailed. Next, a second semiconductor chip 3 is prepared, which has an active surface 30. Further, a plurality of solder bumps 4 are formed on the active surface 30 of the second semiconductor chip 3. By means of these solder bumps 4, the second semiconductor chip 3 is electrically coupled to the first semiconductor chip 1. A gap 5, however, is undesirably left between the active surface 10 of the first semiconductor chip 1 and the active surface 30 of the second semiconductor chip 3. Alternatively, the UBM process can be first performed on the second semiconductor chip 3, and then the solder bumps 4 are implanted on the inner bonding pads 101 on the active surface 10 of the first semiconductor chip 1.

Figure 1E:
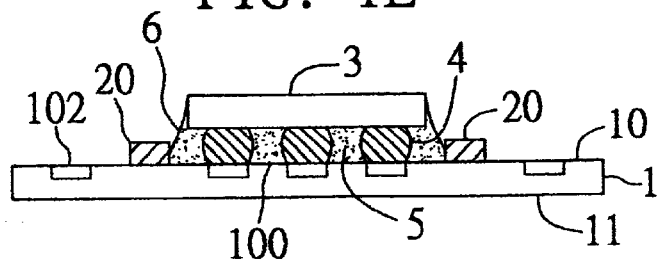

Referring further to FIG. 1E, after solder reflow is completed, a flip-chip underfill process is performed to form an underfill layer 6 from, for example epoxy resin, in the gap 5 between the first semiconductor chip 1 and the second semiconductor chip 3. The underfill layer 6 allows an increase to the mechanical bonding strength between the first semiconductor chip 1 and the second semiconductor chip 3 and a decrease to the stress on the solder bumps 4. During this process, the dispensed resin would be confined by the dam structure 20 to flow only toward and into the gap 5 without flashing to other areas beyond the dam structure 20. As a result, the outer bonding pads 102 can be substantially free of resin flash.

In the foregoing flip-chip package structure, the semiconductor chips 1, 3 can be electrically coupled to external circuitry, such a printed circuit board, by means of the outer bonding pads 102. Moreover, the first semiconductor chip 1 has its inactive surface 11 mounted on a lead frame (not shown), or a substrate (not shown), another semiconductor chip (not shown), or a heat sink (not shown).

Second Preferred Embodiment

Figure 2:
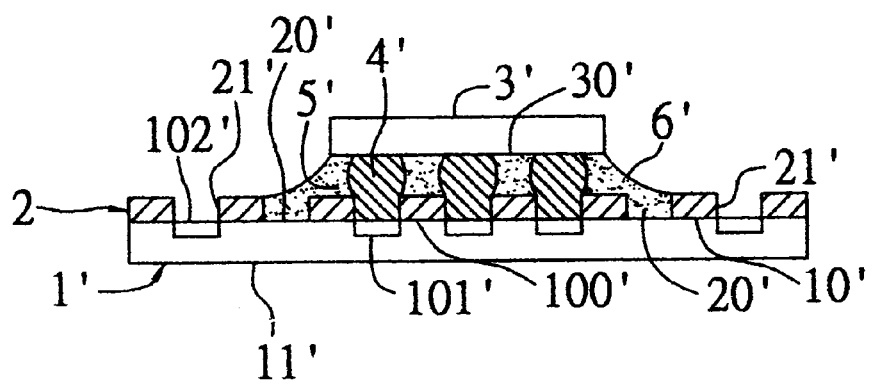
FIG. 2 is a schematic sectional diagram showing a second preferred embodiment of the flip-chip packaging technology of the invention.

FIG. 2 is a schematic sectional diagram showing the second preferred embodiment of the flip-chip packaging technology of the invention. In FIG. 2, the same parts as the previous embodiment are labeled with the same reference numerals appended with an apostrophe.

As shown, the flip-chip package structure of the second preferred embodiment also includes a first semiconductor chip 1' having an active surface 10' and an inactive surface 11'. The active surface 10' is formed with at least one chip-bonding area 100'. Further, a plurality of inner bonding pads 101' are formed in the chip-bonding area 100', while a plurality of outer bonding pads 102' are formed beyond the chip-bonding area 100' on the active surface 10'.

Figure 3:
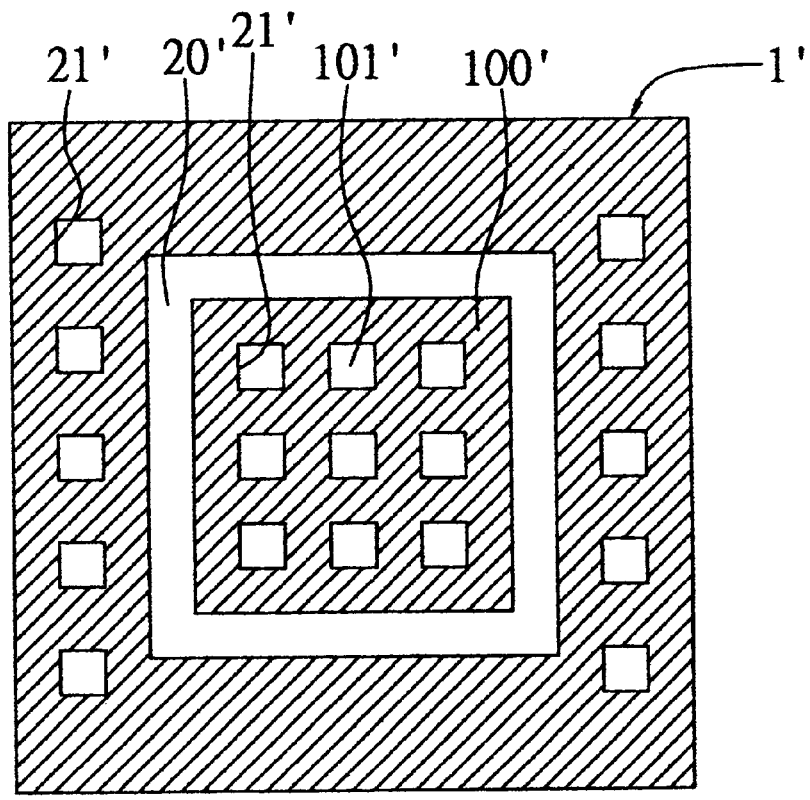
FIG. 3 shows a schematic bottom view of the flip-chip package structure of FIG. 2.

A polyimide coating 2' is formed over the active surface 10' of the first semiconductor chip 1', which is then selectively etched to form a plurality of openings 21' to expose the inner bonding pads 101' and the outer bonding pads 102', with a remaining portion serving as a groove structure 20'. As shown in FIG. 3, the openings 21' allow solder bumps 4' to be directly implanted to the respective inner bonding pads 101'. After reflow of the solder bumps 4' to the corresponding I/O pads (not shown) on the active surface 30' of the second semiconductor chip 3', the second semiconductor chip 3' can be electrically coupled to the first semiconductor chip 1 by means of these solder bumps 4'. A gap 5', however, is undesirably left between the first semiconductor chip 1' and the second semiconductor chip 3'. A flip-chip underfill process is then performed to form an underfill layer 6α in the gap 5' to allow an increase to the mechanical bonding strength between the first semiconductor chip 1' and the second semiconductor chip 3'. During this process, the dispensed resin would be confined by the groove structure 20' to flow only toward and into the gap 5' without flashing to other areas beyond the groove structure 20'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip package structure, which comprises:

a first semiconductor chip having an active surface and an inactive surface, with the active surface being formed with a chip-bonding area; wherein a plurality of inner bonding pads are formed in the chip-bonding area, while a plurality of outer bonding pads are formed beyond the chip-bonding area on the active surface;

a coating layer formed of the active surface of the first semiconductor chip, with the inner and outer bonding pads being exposed to outside of the coating layer;

a flash-barrier structure formed by a portion of the coating layer around the chip-bonding area on the first semiconductor chip to separate the chip-bonding area from the outer bonding pads;

a second semiconductor chip electrically coupled to the first semiconductor chip by means of solder bumps to the chip-bonding area on the first semiconductor chip, with a gap existing between the first semiconductor chip and the second semiconductor chip; and an underfill layer formed in the gap between the first semiconductor chip and the second semiconductor chip, and confined within an area surrounded by the flash-barrier structure.

2. The flip-chip package structure of claim 1, wherein the flash-barrier structure is a protruded dam structure over the first semiconductor chip.

3. The flip-chip package structure of claimed 1, wherein the flash-barrier structure is a groove in the coating layer.

4. The flip-chip package structure of claim 1, wherein the underfill layer is formed from epoxy resin.

5. The flip-chip package structure of claim 1, wherein the coating layer has a thickness smaller than a height of the solder bumps.

* * * * *